US011292030B2

United States Patent
Horsley et al.

(10) Patent No.: US 11,292,030 B2
(45) Date of Patent: Apr. 5, 2022

(54) PIEZOELECTRIC MICROMACHINED ULTRASONIC TRANSDUCERS HAVING STRESS RELIEF FEATURES

(71) Applicant: Chirp Microsystems, Inc., Berkeley, CA (US)

(72) Inventors: David Horsley, Berkeley, CA (US); Andre Guedes, Berkeley, CA (US); Stefon Shelton, Oakland, CA (US); Richard Przybyla, Emeryville, CA (US)

(73) Assignee: CHIRP Microsystems Inc., Berkeley, CA (US)

( * ) Notice: Subject to any disclaimer, the term of this patent is extended or adjusted under 35 U.S.C. 154(b) by 288 days.

(21) Appl. No.: 16/219,387

(22) Filed: Dec. 13, 2018

(65) Prior Publication Data

US 2019/0193116 A1 Jun. 27, 2019

Related U.S. Application Data

(63) Continuation of application No. PCT/US2017/036613, filed on Jun. 8, 2017.
(Continued)

(51) Int. Cl.
*B06B 1/06* (2006.01)
*H01L 41/053* (2006.01)
(Continued)

(52) U.S. Cl.
CPC .......... *B06B 1/0666* (2013.01); *B06B 1/0603* (2013.01); *G10K 9/122* (2013.01);
(Continued)

(58) Field of Classification Search
CPC .. B06B 1/0666; H01L 41/053; H01L 41/0533
(Continued)

(56) References Cited

U.S. PATENT DOCUMENTS

| 5,955,821 | A | 9/1999 | Yamamoto et al. |
| 6,806,545 | B2 | 10/2004 | Shim |

(Continued)

FOREIGN PATENT DOCUMENTS

| WO | 2012145278 A2 | 10/2012 |
| WO | 2017218299 A1 | 12/2017 |

OTHER PUBLICATIONS

Extended European Search Report dated Dec. 17, 2019 for European Patent Application No. 17813825.
(Continued)

*Primary Examiner* — Derek J Rosenau
(74) *Attorney, Agent, or Firm* — JDI Patent; Joshua D. Isenberg; Robert A. Pullman

(57) ABSTRACT

A piezoelectric micromachined ultrasound transducer (PMUT) is disclosed. The device consists of a flexible membrane that is connected to a rigid substrate via flexures. The flexures are defined by slots etched through the perimeter of the membrane. These features release the stress present on the structural layers of the membrane, making it less sensitive to residual stress. The flexures are designed to act as torsion springs so that the membrane's vibration mode shape is highly curved in the piezoelectric actuation area, thereby increasing the electromechanical coupling.

14 Claims, 12 Drawing Sheets

Related U.S. Application Data

(60) Provisional application No. 62/351,876, filed on Jun. 17, 2016.

(51) Int. Cl.
*H01L 41/187* (2006.01)
*G10K 9/122* (2006.01)

(52) U.S. Cl.
CPC ........ *H01L 41/0533* (2013.01); *H01L 41/187* (2013.01); *H01L 41/1876* (2013.01)

(58) Field of Classification Search
USPC .................................. 310/324, 328, 334
See application file for complete search history.

(56) References Cited

U.S. PATENT DOCUMENTS

| | | | |
|---|---|---|---|
| 8,422,703 B2 | 4/2013 | Weigold | |
| 2005/0075572 A1 | 4/2005 | Mills et al. | |
| 2006/0186762 A1* | 8/2006 | Sugiura | H03H 9/588 310/328 |
| 2008/0122317 A1 | 5/2008 | Fazzio et al. | |
| 2009/0151455 A1* | 6/2009 | Wu | G01L 9/0042 73/584 |
| 2010/0327702 A1* | 12/2010 | Martin | G10K 9/125 310/346 |
| 2011/0191997 A1 | 8/2011 | Jiang et al. | |
| 2014/0084396 A1 | 3/2014 | Jenkins et al. | |
| 2015/0165479 A1 | 6/2015 | Lasiter et al. | |
| 2017/0021391 A1 | 1/2017 | Guedes et al. | |
| 2017/0128983 A1 | 5/2017 | Horsley et al. | |
| 2017/0184718 A1 | 6/2017 | Horsley et al. | |
| 2017/0194934 A1 | 7/2017 | Shelton et al. | |
| 2017/0236506 A1 | 8/2017 | Przybyla et al. | |
| 2017/0343637 A1 | 11/2017 | Przybyla et al. | |
| 2018/0246193 A1 | 8/2018 | Kline et al. | |
| 2018/0248477 A1 | 8/2018 | Kline et al. | |
| 2018/0268796 A1 | 9/2018 | Shelton et al. | |

OTHER PUBLICATIONS

International Search Report and Written Opinion dated Sep. 29, 2017 for International Patent Application No. PCT/US2017/036613.

U.S. Appl. No. 15/454,363 to Richard J. Przybyla et al., filed Mar. 9, 2017.

U.S. Appl. No. 15/466,040 to David Horsley et al., filed Mar. 22, 2017.

U.S. Appl. No. 15/625,421 to David Horsley et al., filed Jun. 16, 2017.

U.S. Appl. No. 15/625,458 to David Horsley et al., filed Jun. 16, 2017.

U.S. Appl. No. 15/920,300 to Richard Przybyla et al., filed Mar. 13, 2018.

U.S. Appl. No. 16/165,890 to Mitchell Kline et al., filed Oct. 19, 2018.

U.S. Appl. No. 62/351,876 to David Horsley, filed Jun. 17, 2016.

Extended European Search Report dated Mar. 9, 2021 for European Patent Application No. 17931996.7.

\* cited by examiner

PIEZOELECTRIC MICROMACHINED ULTRASONIC TRANSDUCERS HAVING STRESS RELIEF FEATURES

CLAIM OF PRIORITY

This Application is a continuation of International Patent Application Number PCT/US2016/036613 filed Jun. 8, 2017, the entire contents of which are incorporated herein by reference for all purposes. International Patent Application Number PCT/US2016/036613 claims the Priority Benefit of U.S. Provisional Patent Application No. 62/351,876 filed Jun. 17, 2016 to David A. Horsley et al., entitled "ULTRASONIC TRANSDUCERS HAVING A SLOTTED MEMBRANE DESIGN", the entire contents of which are incorporated herein by reference for all purposes.

STATEMENT REGARDING FEDERALLY SPONSORED RESEARCH OR DEVELOPMENT

The present invention was made under a contract with the National Science Foundation (NSF), an agency of the United States Government, under NSF SBIR Phase II Award 1456376.

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

Microelectromechanical systems (MEMS) devices have been the subject of extensive research since the 1960s, and their commercial application has been a success in the last decade with the introduction of high performance accelerometers and gyroscopes among other sensors and actuators. Reducing size and cost, and boosting performance are important to achieve commercial success in this competitive field.

A piezoelectric micromachined ultrasonic transducer (PMUT) is an acoustic device based on a thin membrane structure that is excited into vibration to transmit an ultrasonic pressure wave into the surrounding medium (for example air, fluid, or human tissue). To transmit ultrasound, the PMUT's vibration is excited by applying a voltage to a piezoelectric layer on the membrane, which produces a piezoelectric stress, thereby deforming the membrane. Conversely, to receive ultrasound, the ultrasonic pressure wave causes the PMUT to vibrate, resulting in stress that is converted into an electrical signal by the piezoelectric layer.

A PMUT typically operates at its resonance frequency, which can be easily tuned by selecting the correct materials and dimensions of the PMUT membrane. However, the PMUT's resonance frequency is also affected by residual stress in the thin film layers that make up the membrane. Tensile stress increases the resonance frequency in much the same way that tension in a string will increase the string's resonance frequency. Variations in stress therefore result in variations in the PMUT's resonance frequency, making it difficult to manufacture PMUTs that operate at a common resonance frequency. For this reason, it is desirable to minimize the effect of residual stress on the PMUT via either: (1) controlling residual stress to very low magnitudes (e.g. by controlling the process conditions during deposition of the various thin-film layers); (2) selectively removing high stress layers from specific areas of the membrane; (3) designing the PMUT's membrane so that it can release residual stress by contracting or expanding after it is released from the supporting substrate.

In terms of performance, PMUTs are quantitatively evaluated by their transmit response, which is the output sound pressure level (SPL) generated per unit voltage input. The SPL is directly proportional to the membrane displacement. A PMUT membrane that is fully clamped to the surrounding substrate, like a drum head, has greater stiffness and therefore requires more input voltage to achieve a given displacement amplitude. Partially releasing the membrane at the edges reduces the stiffness, thereby increasing the displacement per volt.

For both of the reasons outlined above, it is desirable to have a PMUT design that enables the PMUT membrane to be partially released. However, this must be accomplished without degrading the PMUT's acoustic performance and without reducing the mechanical robustness of the PMUT membrane, which may be subjected to mechanical shock, vibration, and over-pressure events.

BRIEF SUMMARY OF THE INVENTION

This invention generally relates to micromachined ultrasonic transducers (MUTs) and more particularly to a design for a piezoelectric micromachined ultrasonic transducer (PMUT) device and a method to fabricate this device. The device consists of a flexible membrane that is perforated by slots at the perimeter of the membrane. The slots allow the membrane to expand or contract when it is released from the substrate, thereby releasing residual stress present in the membrane and making the membrane's resonance frequency much less sensitive to residual stress. In accordance with an embodiment, a single ring of slots surrounds the membrane perimeter, defining a number of flexures that connect the membrane to the substrate. The flexures act as torsion springs, so that the membrane vibrates in a curved mode-shape. In another embodiment, the flexures are defined by two concentric rings of slots.

BRIEF DESCRIPTION OF THE SEVERAL VIEWS OF THE DRAWING(S)

The invention will be more fully understood by reference to the following drawings which are for illustrative purposes only:

Figure 3:
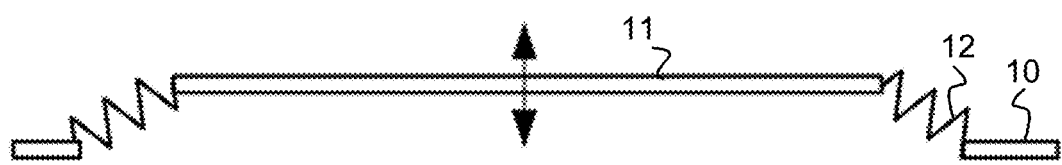

FIG. 3 schematically shows the piston-like vibration mode shape of a PMUT based on a membrane supported by translational spring flexures.

Figure 4:
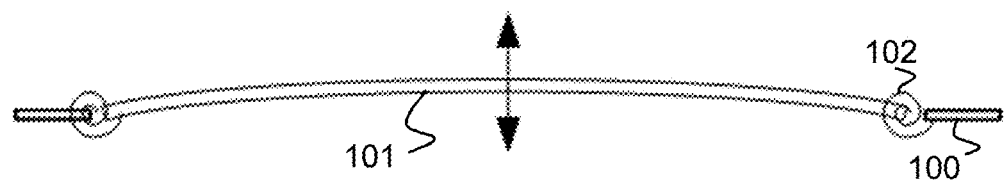

FIG. 4 schematically shows the flexural vibration mode shape of a PMUT based on a membrane supported by torsional spring flexures.

Figure 5A:
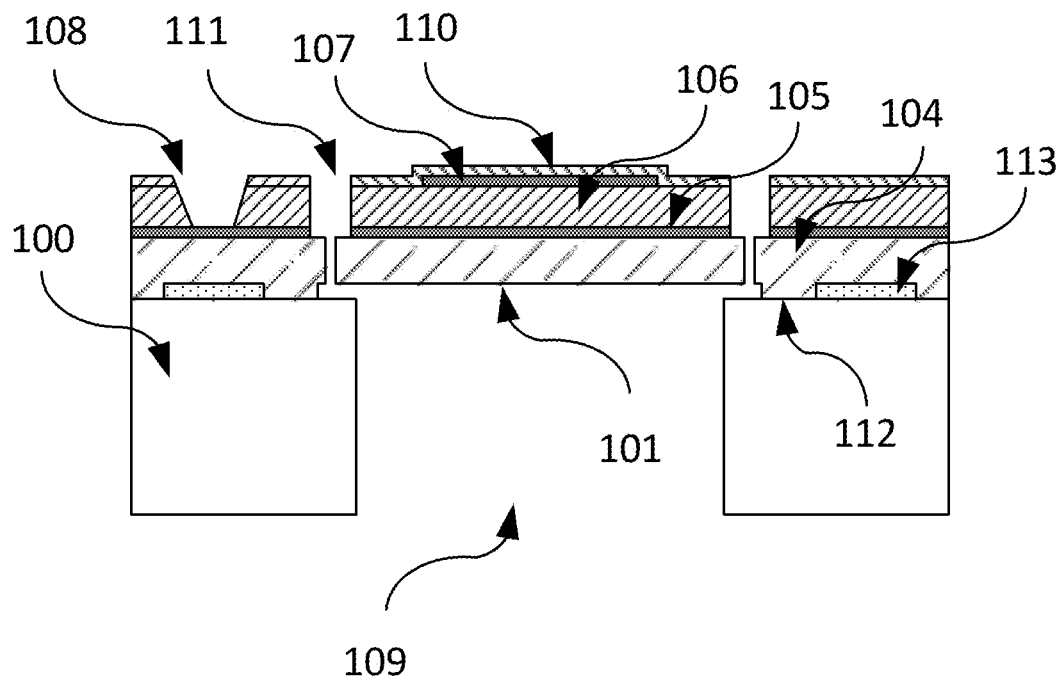

FIG. 5A shows a cross section view of a PMUT in accordance with an aspect of the present disclosure.

Figure 5B:
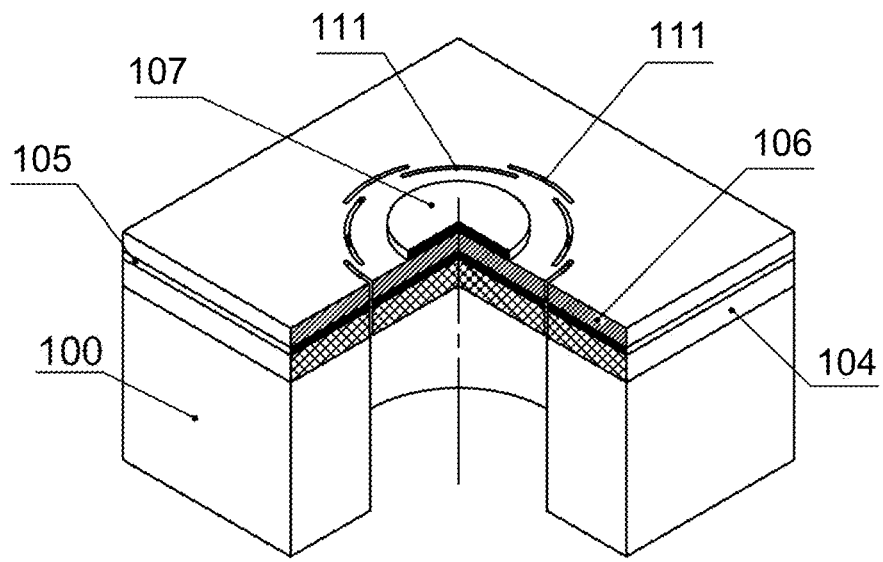

FIG. 5B shows a cutaway three-dimensional view of a PMUT in accordance with an aspect of the present disclosure.

Figure 6A:
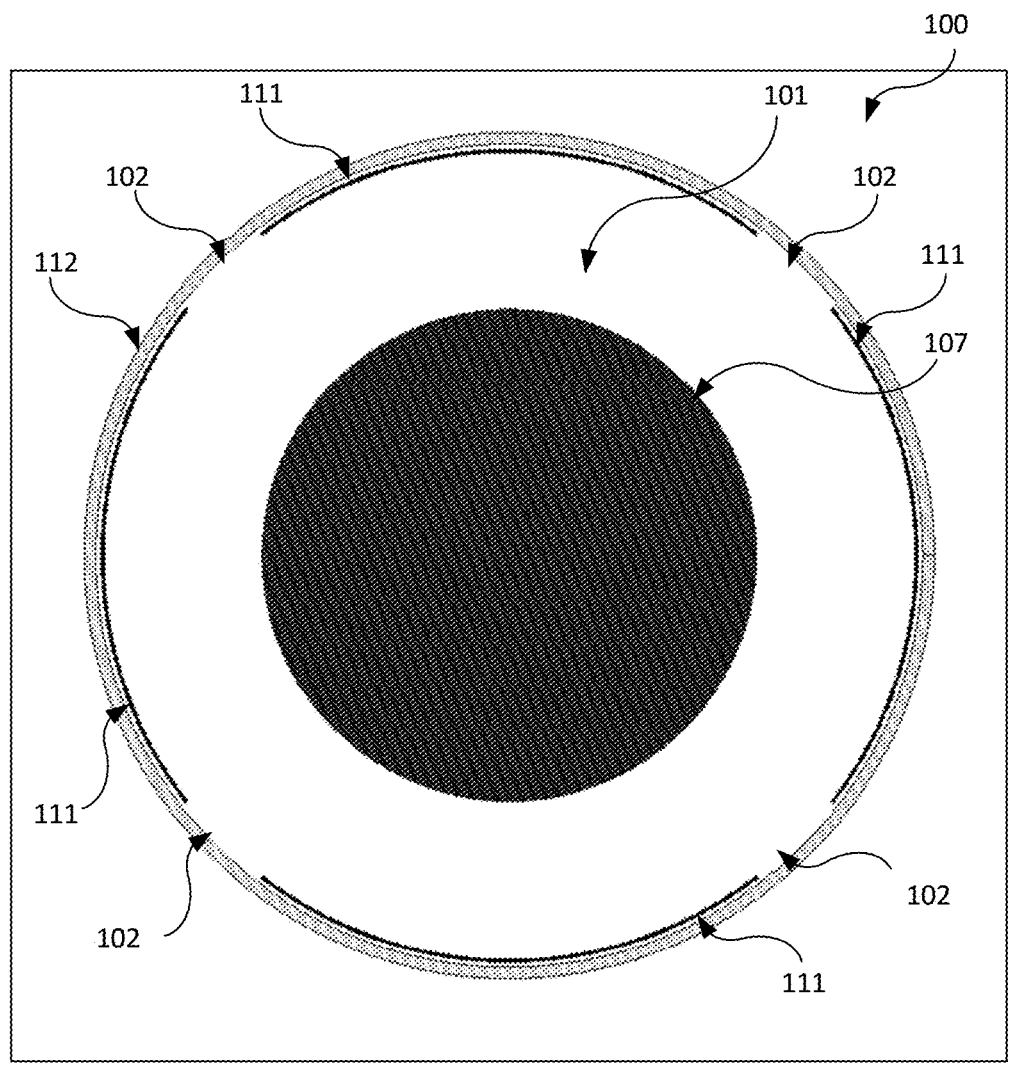

FIG. 6A is a top view of a PMUT in accordance with an embodiment

Figure 6B:
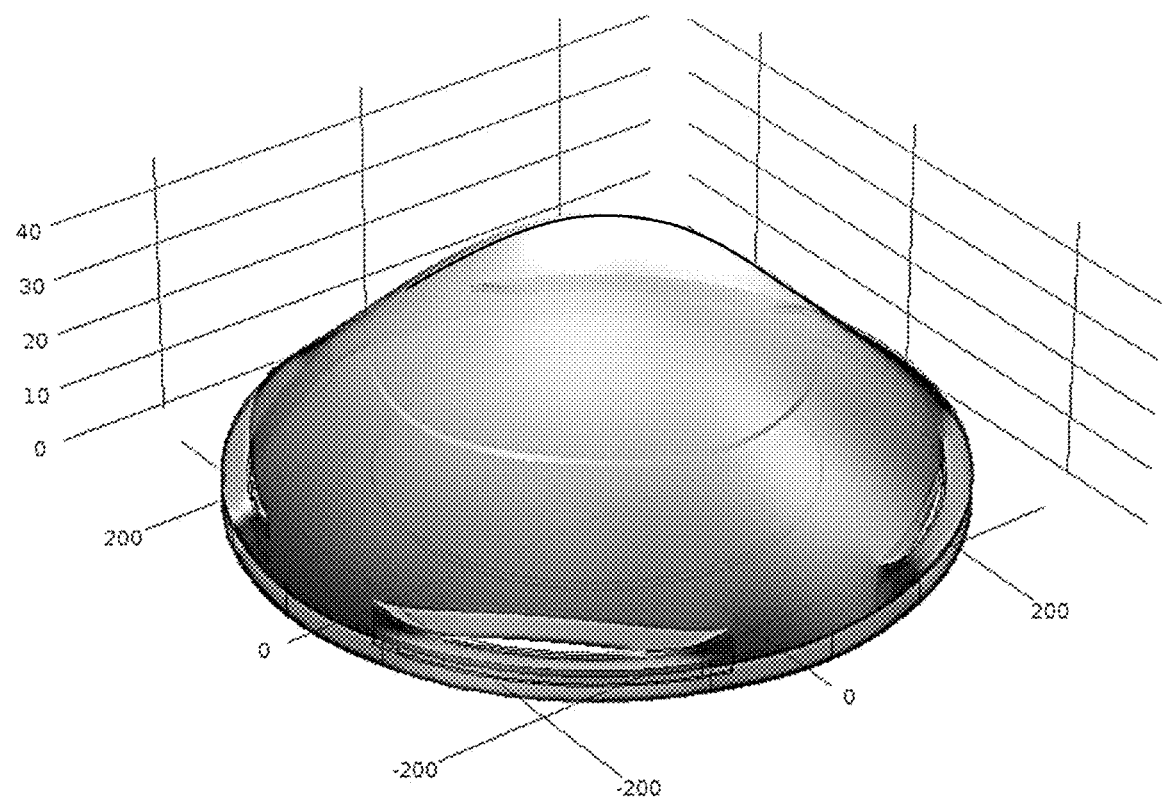
Figure 7:
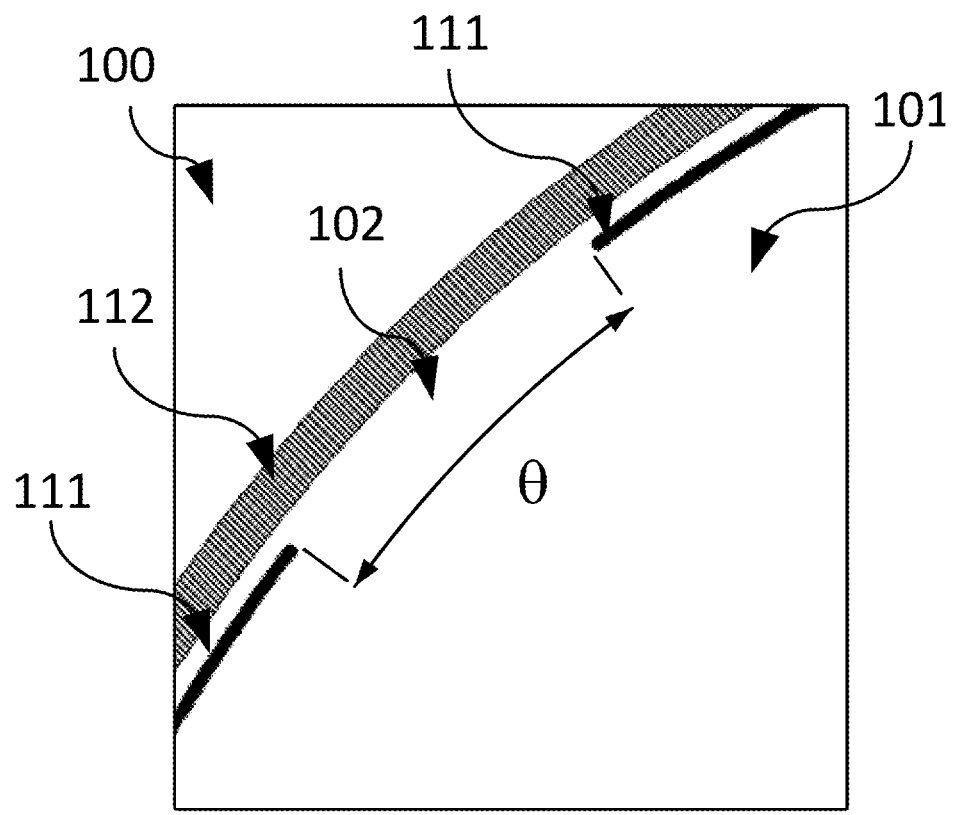

FIG. 6B is a three-dimensional graph illustrating a curved vibration mode shape for a PMUT of the design depicted in FIG. 6A FIG. 7 is a close-up top view of a flexure in the PMUT of FIG. 6A.

Figure 8:
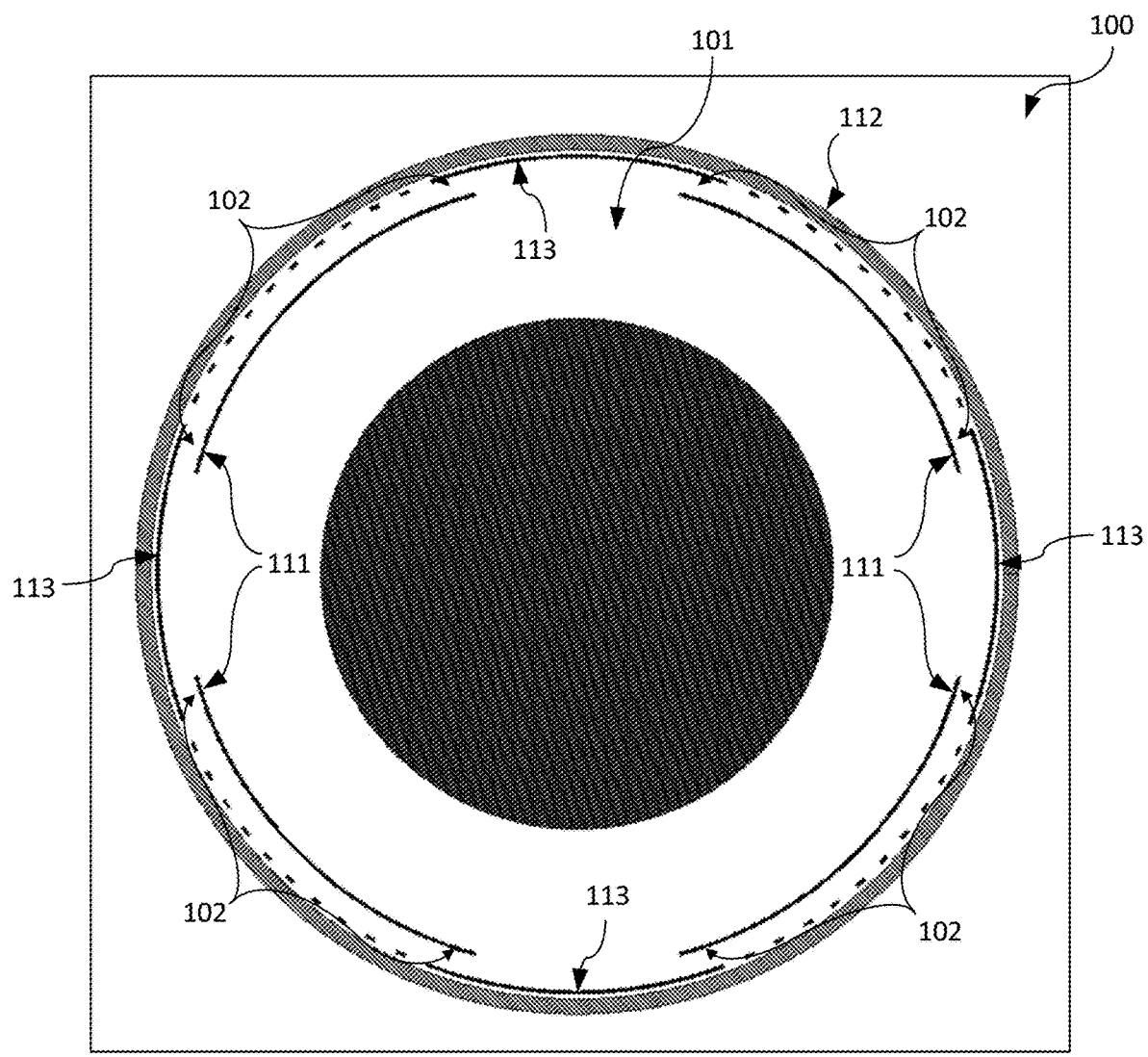

FIG. 8 shows a top view of a PMUT in accordance with an embodiment.

Figure 9:
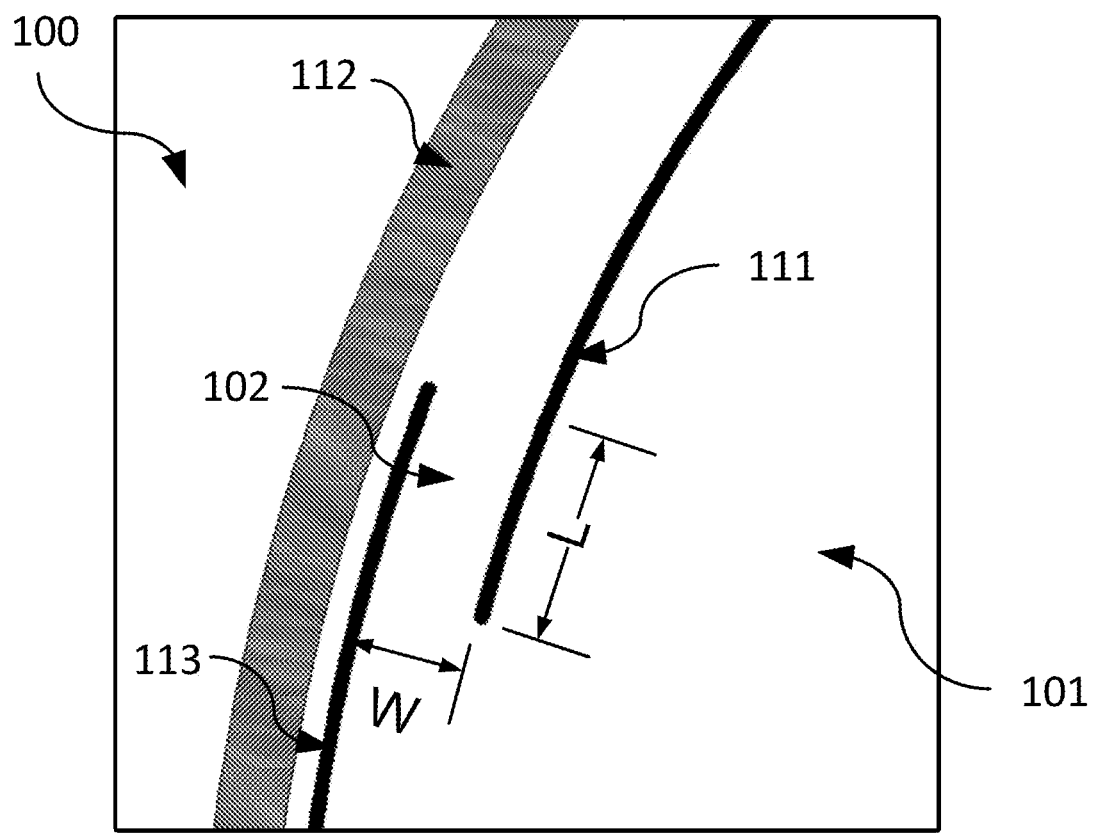

FIG. 9 is a close-up top view of the flexure shown in FIG. 8.

Figure 10:
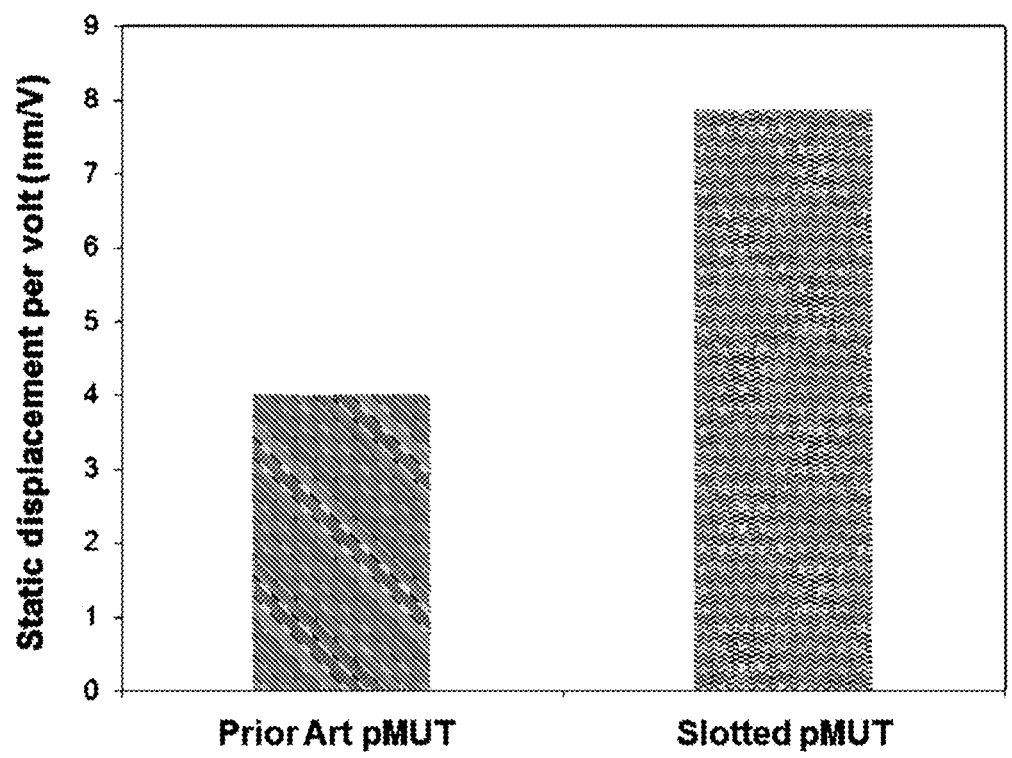

FIG. 10 presents the simulated vibration displacement of an embodiment compared to a prior art PMUT.

Figure 11:
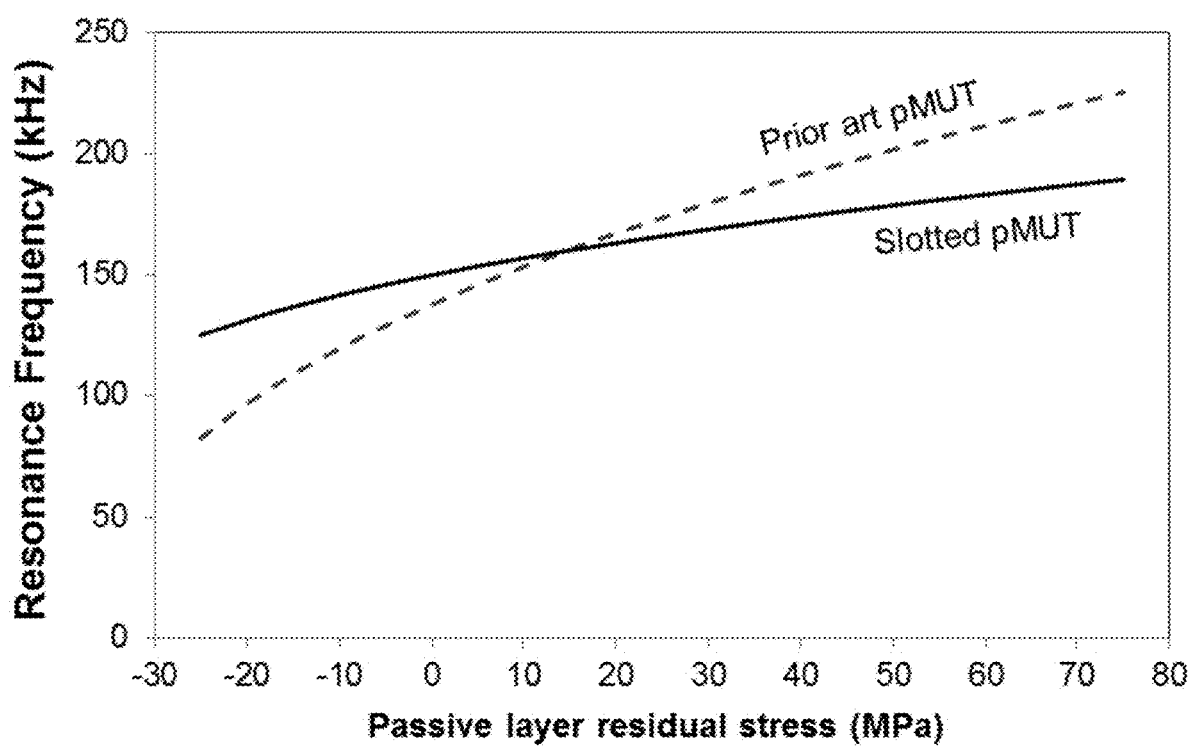

FIG. 11 presents the simulated vibration resonance frequency as a function of residual stress in the membrane of an embodiment compared to a prior art PMUT.

Figure 12A:
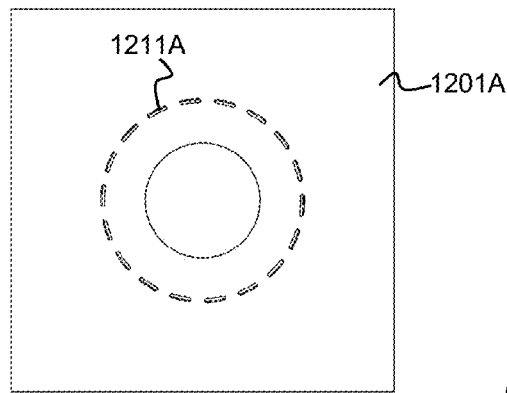
Figure 12B:
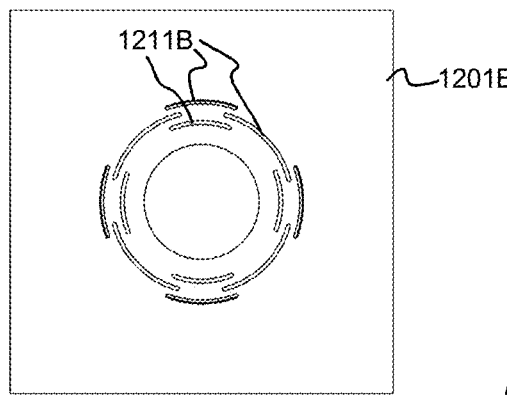
Figure 12C:
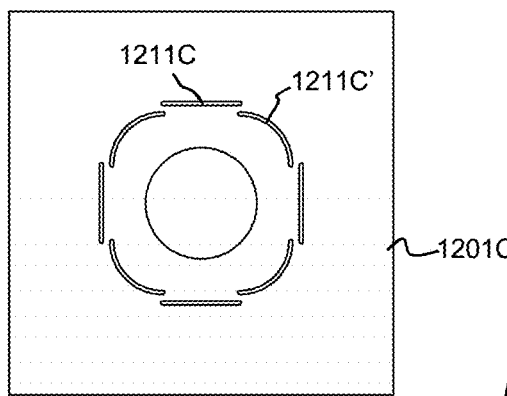

FIGS. 12A-12C are top view diagrams depicting examples of alternative implementations of a PMUT in accordance with aspects of the present disclosure.

DETAILED DESCRIPTION OF THE INVENTION

Although the description herein contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art.

Aspects of this disclosure include a piezoelectric micromachined ultrasonic transducer (PMUT) composed of a flexurally-suspended membrane. It will be appreciated that the following embodiments are provided by way of example only, and that numerous variations and modifications are possible. For example, while circular embodiments are shown, the PMUT may have many different shapes such as square, triangular, rectangular, hexagonal, octagonal, and so on. Furthermore, while PMUTs are shown having a unimorph construction, consisting of a single piezoelectric layer on a passive layer, bimorph and multimorph PMUTs having multiple piezoelectric layers and various electrode patterns are possible. All such variations that would be apparent to one of ordinary skill in the art are intended to fall within the scope of this disclosure. It will also be appreciated that the drawings are not necessarily to scale, with emphasis being instead on the distinguishing features of the PMUT device disclosed herein.

Figure 1:
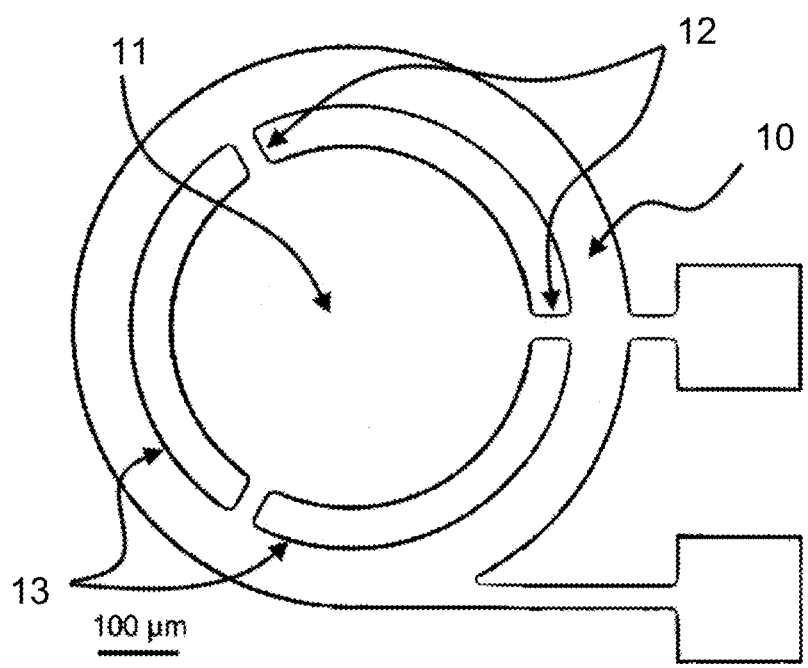
FIG. 1 is a top view of a prior art piezoelectric micromachined ultrasonic transducer.
Figure 2:
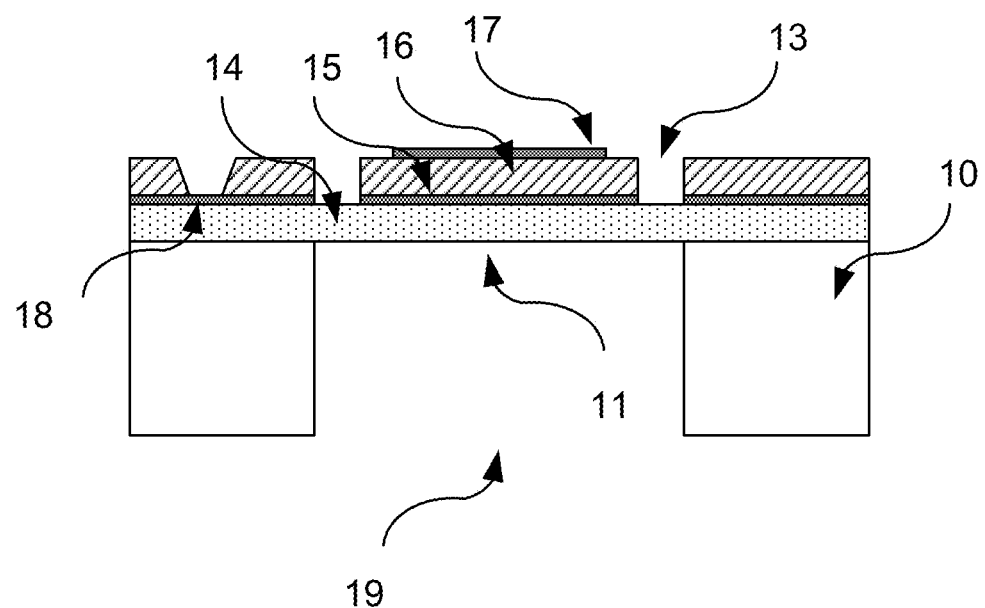
FIG. 2 is a cross section view of a prior art piezoelectric micromachined ultrasonic transducer.

A flexurally-suspended PMUT design was published in A. Guedes, S. Shelton, R. Przybyla, I. Izyumin, B. Boser, and D. Horsley, "Aluminum nitride pMUT based on a flexurally-suspended membrane," in the Proceedings of the 16th International Conference on Solid-State Sensors and Actuators (Transducers), Beijing, China, 2011. This prior art PMUT design, illustrated in FIG. 1, consists of a membrane 11 connected to a rigid substrate 10 via three flexures 12 formed by three slots 13 between membrane 11 and substrate 10. A cross-section of the prior art PMUT is shown in FIG. 2. This PMUT is a piezoelectric unimorph, wherein membrane 11 is a multi-layer laminate, composed of an elastic layer 14 and a piezoelectric layer 16 that is sandwiched between a bottom electrode 15 and a top electrode 17. A port 19 etched into substrate 10 releases membrane 11, allowing membrane 11 to vibrate to transmit and receive ultrasound waves into the surrounding medium. In accordance with Guedes, slots 13 are formed by partially etching through membrane 11, and elastic layer 14 is retained within the slots 13 to prevent the ultrasonic pressure from being diverted from the front of membrane 11 to the back of membrane (where the back of the membrane is the surface having electrode layer 17), thereby reducing the PMUT's output pressure.

Guedes discloses a problem of this prior art PMUT, illustrated in FIG. 3, which shows a simplified vibration mode-shape of a membrane 11 vibrating as it receives an incident ultrasonic pressure wave (an identical vibration mode is excited when membrane 11 is used to transmit an ultrasonic pressure wave). The vibration mode shape of membrane 11 is substantially like a piston, with the majority of the deformation occurring in the flexures 12 while membrane 11 remains substantially flat. The problem that this mode-shape poses is that the piezoelectric layer 16 is weakly coupled to the vibration mode-shape. The practical consequence of this weak electromechanical coupling is that the vibration amplitude per unit input voltage is low when the device is used as a transmitter; conversely, when the PMUT is used as a receiver, the output voltage per unit input pressure is low. The electromechanical coupling is low because membrane 11 has very little curvature in the active piezoelectric area where the top electrode 17 and bottom electrode 15 overlap.

FIG. 4 illustrates the desired vibration mode-shape of a PMUT with high electromechanical coupling. Flexures 102, shown as torsion springs, couple a membrane 101 to a substrate 100 to enable curvature of a membrane 101 as it vibrates.

The cross-section of a PMUT in accordance with an aspect of the present disclosure is shown in FIG. 5A. FIG. 5B shows a cutaway three-dimensional view of this PMUT. A membrane 101 is connected to a substrate 100. Membrane 101 is a laminate formed from an elastic layer 104 and a piezoelectric layer 106 sandwiched between a top electrode 107 and bottom electrode 105. The elastic layer 104 may be polycrystalline or single crystalline silicon or other materials including $SiO_2$ and $Si_3N_4$. The thickness of elastic layer 104 may be from 0.5 μm to 6 μm. Piezoelectric layer 106 may be AlN, ZnO, or PZT, and alloys of these materials such as ScAlN, PLZT, and PNZT. The thickness of piezoelectric layer 106 may be from 0.2 μm to 3 μm. The top electrode layer 107 and piezoelectric layer 106 are protected using a passivation layer 110 that protects the top electrode 107 and piezoelectric layer 106 from the environment. Passivation layer 110 may be a dielectric such as $Si_3N_4$, $SiO_2$, AlN, $Al_2O_3$, $HfO_2$, $ZrO_2$, $TiO_2$, or a composite of these materials.

The elastic layer 104 of membrane 101 is connected to substrate 100 via anchors 112. These anchors may be formed by patterning a sacrificial layer 113 that is deposited on substrate 100. In an embodiment, substrate 100 is a silicon wafer and sacrificial layer 113 is $SiO_2$ that is deposited or grown on substrate 100 before depositing a polysilicon elastic layer 104. Slots 111 are etched through all the layers that form membrane 101. Note that as shown in FIG. 5A, slots 111 may be formed by etching small openings in elastic layer 104 and larger openings in the piezoelectric stack consisting of bottom electrode layer 105, piezoelectric layer 106, top electrode layer 107 and passivation layer 110. In some embodiments, the piezoelectric stack consisting of the aforementioned layers 105, 106, 107 and 110 may be selectively removed from large portions of the elastic layer 104 before etching slots 111 through elastic layer 104. Port 109 is etched through the substrate 101 using deep reactive ion etching (DRIE), after which the sacrificial layer 113 beneath membrane 101 is removed. The sacrificial layer may be removed via wet hydrofluoric acid (HF) etching, vapor-phase HF etching, or plasma etching.

A top view of an embodiment is shown in FIG. 6A. The flexible membrane 101 is connected to substrate 100 via four flexures 102. A circular top electrode 107 is located in the center of membrane 101. The geometry of the flexures 102 is defined by four slots 111 etched through membrane 101. The flexures 102 connect the membrane 101 to the circular anchor 112. FIG. 6B three-dimensionally illustrates a vibration mode for a flexible membrane of the type shown in FIG. 6A.

A close-up view of one of the four flexures 102 is shown in FIG. 7. The angular extent of the flexure 102, indicated as θ in FIG. 7, may be in the range from 5 degrees to 30 degrees. The slots 111 etched through the membrane determine the length of the flexure 102. The width of the slots 111 may be in the range from 1 μm to 10 μm. As shown in FIG. 7, the slots may have rounded corners to prevent stress concentrations.

A top view of a second embodiment is shown in FIG. 8. Eight flexures 102 connect the flexible membrane 101 to the circular anchor 112 that is attached to substrate 100. The geometry of the flexures 102 is defined by two concentric rings of overlapping interrupted slots, an inner ring of four slots 111 and an outer ring of four slots 113. A close-up view of one of the eight flexures 102 is shown in FIG. 9. The width of slots 111 and 113 may be in the range from 1 μm to 5 μm. The overlap angle of inner slot 111 and outer slot 113 defines the length (L) and width (W) of flexure 102.

Perforating the perimeter of membrane 101 with slots 111 and 113 conveys a number of advantages. First, when properly designed, flexures 102 act as torsional springs as illustrated in FIG. 4 so that membrane 101 has a vibration mode-shape that has significant curvature beneath the top electrode 107. Second, slots 111 and 113 allow membrane 101 to expand or contract in the plane of the substrate to release in-plane residual stress present in the layers that compose membrane 101. In a PMUT that is based on a continuous membrane, similar to a drum head, the vibration mode's resonance frequency is highly sensitive to residual stress in the membrane. To demonstrate both of these advantages, a finite element method (FEM) simulation was performed on both a prior-art continuous-membrane PMUT and an embodiment of the slotted-membrane PMUT. The vibration amplitude per unit volt input, normalized by the quality factor (Q) of the vibration mode, is plotted in FIG. 10. The slotted PMUT achieves a peak displacement that is twice the amplitude of the prior art design. The resonance frequency of the two designs is compared in FIG. 11. The resonance frequency of the slotted PMUT changes by approximately a factor of three less than that of the prior art design.

All cited references are incorporated herein by reference in their entirety. In addition to any other claims, the applicant(s)/inventor(s) claim each and every embodiment of the invention described herein, as well as any aspect, component, or element of any embodiment described herein, and any combination of aspects, components or elements of any embodiment described herein.

Some variations on the implementations described above are shown in FIGS. 12A-12C. Specifically, FIG. 12A depicts an example of an implementation of a PMUT similar to that shown in FIGS. 5A-5B in which a single ring of interrupted slots 1211A is formed by a relatively large number (e.g., more than four) relatively small concentric arcuate perforations in a membrane 1201A. In the illustrated example there is a ring of 20 evenly angularly spaced arcuate slots 1211A. FIG. 12B depicts a PMUT implementation of a PMUT similar to that shown in FIGS. 5A-5B having three concentric rings of overlapping interrupted arcuate slots 1211B in a membrane 1201B. Other implementations may use a larger number of concentric rings of such slots. Aspects of the present disclosure are not limited to those in which the slots are arcuate. For example, FIG. 12C depicts an example of a PMUT implementation similar to that shown in FIGS. 5A-5B that uses a combination of overlapping interrupted concentric straight slots 1211C and arcuate slots 1211C' in a membrane 1201C. As in FIGS. 5A-5B, the membranes illustrated in FIGS. 12A-12C may be in the form of a laminate formed from an elastic layer and a piezoelectric layer sandwiched between a top electrode and bottom electrode. Each membrane may be connected to a substrate by anchors.

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112(f). In particular, the use of "step of" in the claims herein is not intended to invoke the provisions of 35 USC § 112(f).

What is claimed is:

1. A piezoelectric micromachined ultrasonic transducer (PMUT) device, comprising:
    a substrate having an opening formed therethrough;
    a membrane assembly formed from at least one elastic layer and at least one piezoelectric layer sandwiched between a top electrode layer and a bottom electrode layer, the top electrode layer being encapsulated with a passivation layer;
    the membrane assembly being attached to the substrate over the opening;
    the membrane assembly including two or more flexures coupling the diaphragm to an anchor region connected to the substrate;
    the two or more flexures being defined by two or more concentric interrupted slots etched through the membrane layer proximate an edge of the opening, wherein portions of the piezoelectric layer and top and bottom electrode layers are removed from portions of the membrane near the concentric interrupted slots which are formed through the elastic layer, wherein the two or more flexures are configured to act as torsion springs that permit a portion of the membrane assembly over the opening to vibrate with a curved vibration mode shape.

2. The device of claim 1, wherein the elastic layer includes a layer of polysilicon or single-crystal silicon.

3. The device of claim 1, wherein the piezoelectric layer is Aluminum Nitride (AlN) or an alloy of AlN such as ScAlN.

4. The device of claim 1, wherein the piezoelectric layer is Lead Zirconate Titanate (PZT) or an alloy of PZT such as PLZT or PNZT.

5. The device of claim 1, wherein the two or more flexures are defined by at least two slots at a perimeter of the membrane.

6. The device of claim 1, wherein the two or more flexures are defined by two or more concentric rings of slots, each concentric ring having two or more slots in each of the two or more concentric rings.

7. The device of claim 6, wherein the two or more flexures are configured to act as torsion springs that permit the membrane to vibrate with a curved vibration mode shape of the membrane.

8. The device of claim 1, wherein the two or more concentric interrupted slots include two or more overlapping concentric interrupted slots.

9. The device of claim 8, wherein the two or more overlapping concentric interrupted slots include two or more rings of concentric interrupted slots.

10. The device of claim 8, wherein the two or more overlapping concentric interrupted slots include three or more rings of concentric interrupted slots.

11. The device of claim 1, wherein the two or more concentric interrupted slots include a single ring of perforations in the membrane.

12. The device of claim 1 wherein the two or more concentric interrupted slots include two or more arcuate slots.

13. The device of claim 1 wherein the two or more concentric interrupted slots include one or more straight slots.

14. The device of claim 8, wherein the two or more overlapping concentric interrupted slots include a ring of two or more interrupted arcuate slots that overlap with a concentric ring of two or more straight slots.

* * * * *